(12) United States Patent
Jo et al.

(10) Patent No.: US 10,419,001 B2
(45) Date of Patent: Sep. 17, 2019

(54) LOOK UP TABLE INCLUDING MAGNETIC ELEMENT, FPGA INCLUDING THE LOOK UP TABLE, AND TECHNOLOGY MAPPING METHOD OF THE FPGA

(71) Applicants: SK hynix Inc., Icheon (KR); Industry-Academic Cooperation Foundation Yonsei University, Seoul (KR)

(72) Inventors: Kangwook Jo, Goyang (KR); Jeongbin Kim, Seoul (KR); Minyoung Im, Seoul (KR); Taehee You, Incheon (KR); Eui-Young Chung, Seongnam (KR); Hongil Yoon, Seoul (KR)

(73) Assignees: SK Hynix Inc., Icheon (KR); Industry-Academic Cooperation Foundation Yonsei University, Seoul (KR)

( * ) Notice: Subject to any disclaimer, the term of this patent is extended or adjusted under 35 U.S.C. 154(b) by 120 days.

(21) Appl. No.: 15/802,148

(22) Filed: Nov. 2, 2017

(65) Prior Publication Data

US 2018/0287614 A1   Oct. 4, 2018

(30) Foreign Application Priority Data

Mar. 28, 2017   (KR) .......................... 10-2017-0038994

(51) Int. Cl.
*G06F 17/50* (2006.01)
*H03K 19/177* (2006.01)
(Continued)

(52) U.S. Cl.
CPC ....... *H03K 19/1776* (2013.01); *G06F 17/505* (2013.01); *G06F 17/5054* (2013.01);
(Continued)

(58) Field of Classification Search
CPC .................................................... G06F 17/505
(Continued)

(56) References Cited

U.S. PATENT DOCUMENTS 9,306,151 B2 *   4/2016   Vrudhula ................ H01L 43/02
9,437,260 B2     9/2016   Prenat et al.
(Continued)

OTHER PUBLICATIONS

Shuu'Ichirou Yamamoto et al., "Nonvolatile Power-Gating Field-Programmable Gate Array Using Nonvolatile Static Random Access Memory and Nonvolatile Flip-Flops Based on Pseudo-Spin-Transistor Architecture with Spin-Transfer-Torque Magnetic Tunnel Junctions", Japanese Journal of Applied Physics, 2012, pp. 11PB02-1-11PB02-5, vol. 51, The Japan Society of Applied Physics.
(Continued)

*Primary Examiner* — Suresh Memula (57) ABSTRACT

A look up table (LUT) includes a decoder configured to decode input signals and to output decoded signals, a storage unit including a plurality of magnetic elements an being configured to select one or more of the plurality of magnetic elements in response to the decoded signals and a signal input/output (TO) unit configured to output an output signal corresponding to the selected one or more magnetic elements and to program the selected one or more magnetic elements by receiving a write signal.

19 Claims, 9 Drawing Sheets

(51) Int. Cl.
*H03K 19/00* (2006.01)
*H03K 19/173* (2006.01)
*H03K 19/20* (2006.01)
*G11C 11/16* (2006.01)

(52) U.S. Cl.
CPC ..... *H03K 19/0013* (2013.01); *H03K 19/1731* (2013.01); *H03K 19/17744* (2013.01); *H03K 19/20* (2013.01); *G11C 11/1673* (2013.01); *G11C 11/1675* (2013.01)

(58) Field of Classification Search
USPC ........................................................ 716/104
See application file for complete search history.

(56) References Cited

U.S. PATENT DOCUMENTS

| | | | | |
|---|---|---|---|---|
| 2008/0238475 | A1* | 10/2008 | Chua-Eoan | H03K 19/17736 326/38 |
| 2010/0039136 | A1 | 2/2010 | Chua-Eoan et al. | |
| 2014/0070344 | A1* | 3/2014 | Khalili Amiri | H01L 43/08 257/421 |
| 2014/0210514 | A1* | 7/2014 | Lin | H03K 19/1776 326/41 |
| 2014/0355330 | A1* | 12/2014 | Endoh | H03K 3/356139 365/148 |
| 2016/0065218 | A1* | 3/2016 | Oda | H03K 19/1776 326/38 |
| 2018/0212607 | A1* | 7/2018 | Oda | H03K 19/17792 |

OTHER PUBLICATIONS

Weisheng Zhao et al., "Spin Transfer Torque (STT)-MRAM-Based Runtime Reconfiguration FPGA Circuit", ACM Transactions on Embedded Computing Systems, Oct. 2009, pp. 14:1-14:16, vol. 9, No. 2, ACM.

Somnath Paul et al., "Hybrid CMOS-STTRAM Non-Volatile FPGA: Design Challenges and Optimization Approaches", Proceedings of the 2008 IEEE/ACN International Conference on Computer-Aided Design, 2008, pp. 589-592.

Yue Zhang et al., "Compact Modeling of Perpendicular-Anisotropy CoFeB/MgO Magnetic Tunnel Junctions", IEEE Transactions on Electron Devices, Mar. 2012, pp. 819-826, vol. 59, No. 3, IEEE.

Alan Mishchenko, "Technology Mapping with Choices, Priority Cuts, and Placement-Aware Heuristics", 2010, pp. 1-56, https://people.eecs.berkeley.edu/~alanmi/presentations/ls01.ppt.

Sumanta Chaudhuri et al., "High Density Asynchronous LUT Based on Non-Volatile MRAM Technology", International Conference on Field Programmable Logic and Applications, 2010, pp. 374-379, IEEE Computer Society.

Valavan Manohararajah et al., "Heuristics for Area Minimization in LUT-based FPGA Technology Mapping," TCAD, Nov. 2006, pp. 2331-2340, vol. 25, No. 11.

* cited by examiner

FIG. 1

<PRIOR ART>

LOOK UP TABLE INCLUDING MAGNETIC ELEMENT, FPGA INCLUDING THE LOOK UP TABLE, AND TECHNOLOGY MAPPING METHOD OF THE FPGA

CROSS-REFERENCE TO RELATED APPLICATION

The present application claims priority to Korean Patent Application No. 10-2017-0038994, filed on Mar. 28, 2017, which is incorporated by reference herein in its entirety.

BACKGROUND

1. Field

Embodiments of the present disclosure relate to a Look Up Table (LUT) including a magnetic element, a Field Programmable Gate Array (FPGA) including the LUT, and a technology mapping method applicable to the FPGA.

More particularly, embodiments of the present disclosure relate to a LUT capable of reducing a cell area and a static current, an FPGA including the LUT, and a technology mapping method applicable to the FPGA.

2. Description of the Related Art

A Field Programmable Gate Array (FPGA) is a type of Programmable Logic Device (PLD) that is widely used to design digital circuits that perform specific operations through programs.

The FPGA includes configurable logic blocks (CLBs), input/output blocks (IOBs), and configurable connection circuits that connect the CLBs and the IOBs. The FPGA may further include delay locked loops (DLLs), random access memories (RAMs), and the like.

The CLB includes at least two sub-circuits, one of which is a register circuit such as a flip-flop, the other of which is a function generator circuit that can be implemented with a LUT.

A conventional LUT includes a plurality of static RAMs (SRAMs) and multiplexors (MUXs), and outputs data programmed in the SRAMs according to a combination of input signals that controls the MUXs to perform functions.

Such a conventional LUT is easy to implement a combinational logic circuit and a sequential logic circuit, but when the power is interrupted, data stored in the SRAMs are destroyed and a program must be newly executed.

Accordingly, an LUT including a nonvolatile element, such as a magnetic element rather than an SRAM, has been proposed.

Figure 1:
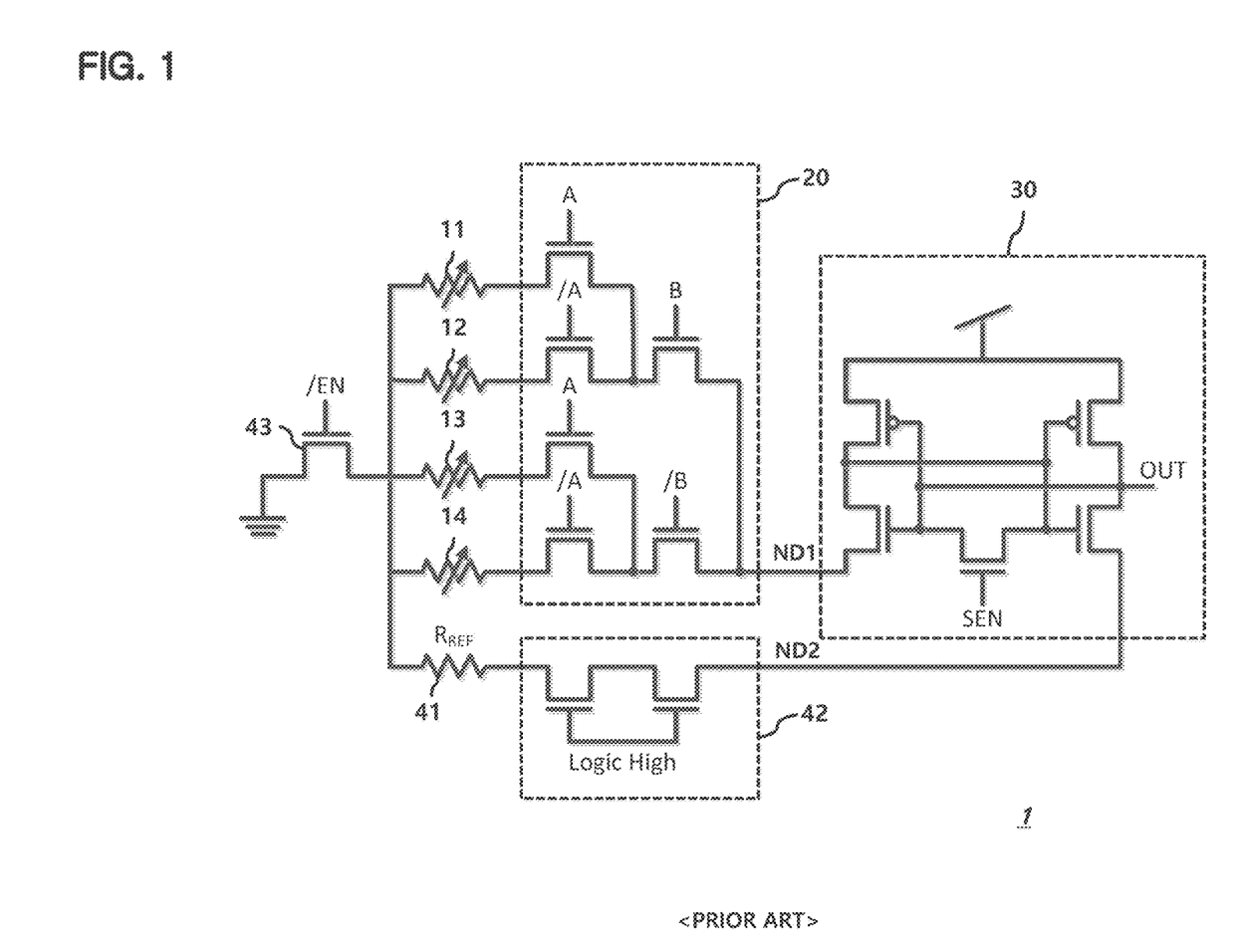
FIG. 1 is a circuit diagram of a conventional LUT circuit.

FIG. 1 shows a conventional LUT circuit 1 including a magnetic tunnel junction (MTJ).

The conventional LUT circuit 1 includes MTJ cells 11, 12, 13, and 14, a MUX 20, a sense amplifier 30, a reference resistor 41, a first switch 42, and a second switch 43.

During an operation of the LUT circuit 1, the first switch 42 and the second switch 43 are turned on.

The MUX 20 selects one of the MTJ cells 11 to 14 according to logic levels of two input signals A and B and provides the selected one to a first node ND1 of the sense amplifier 30.

Each of The MTJ cells 11 to 14 is pre-programmed to have a low resistance or a high resistance. The reference resistor 41 has an intermediate value between the low resistance and the high resistance of the MTJ cell.

The reference resistor 41 is connected to a second node ND2 of the sense amplifier 30.

The sense amplifier 30 is activated in response a sense signal SEN, before a pre-charge operation.

When the sense signal SEN is inactive, the sense amplifier 30 amplifies a current difference generated according to a voltage difference between the first node ND1, which is coupled to the selected MTJ cell, and the second node ND2, which is coupled to the reference resistor 41. The sense amplifier 30 outputs the amplified signal as an output signal OUT.

Since the conventional LUT circuit 1 needs to activate and deactivate the sense signal SEN every time the input signals A and B are changed, it is difficult to configure a combinational logic circuit in which the output signal OUT changes immediately according to the input signals A and B. Instead, only sequential combinational logic circuits can be constituted in the conventional LUT circuit 1.

In addition, an operation speed of the sense amplifier 30 operating in a current mode is relatively slow.

Figure 2:
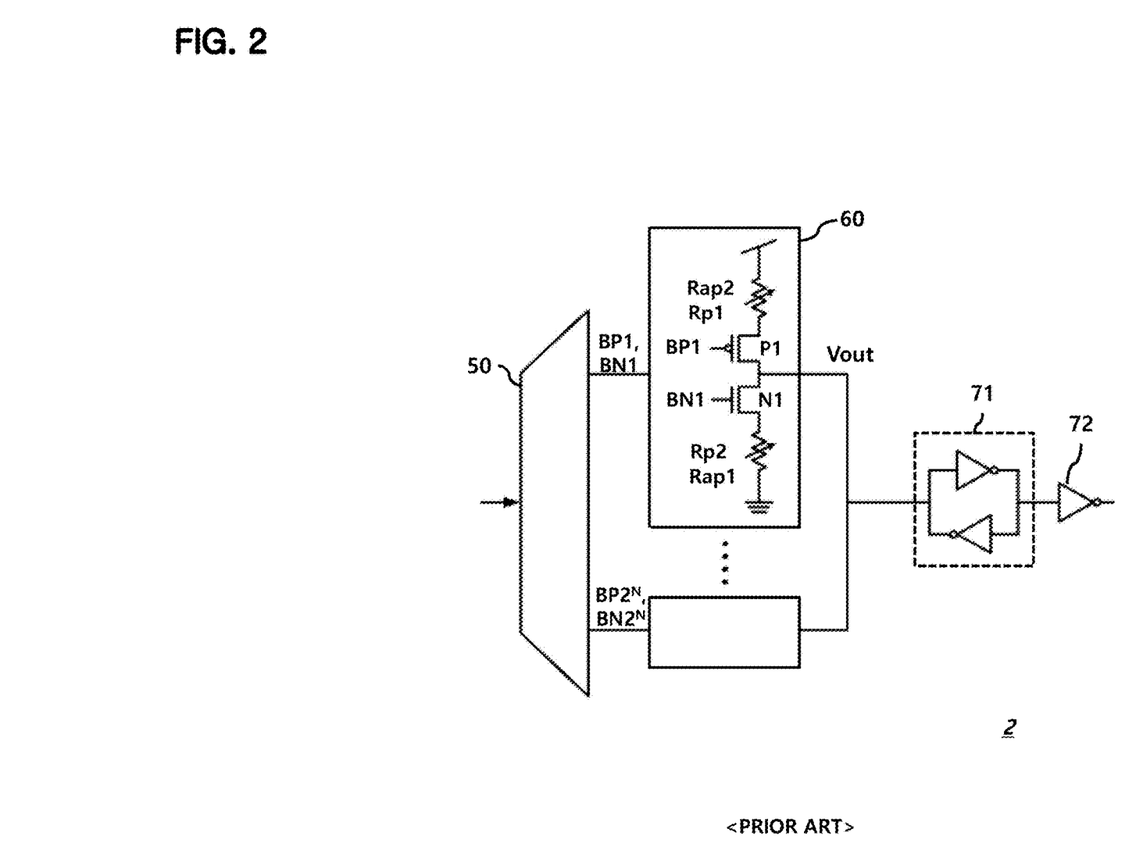
FIG. 2 is a circuit diagram of another conventional LUT circuit.

FIG. 2 shows another conventional LUT circuit 2.

The conventional LUT circuit 2 includes a decoder 50, a plurality of magnetic circuits 60, a latch 71, and an inverter 72.

The latch 71 inverts and stores outputs of the plurality of magnetic circuits 60. The inverter 72 inverts an output of the latch 71 and outputs the inverted output.

The decoder 50 decodes N input signals into $2^N$ input signals, N being a positive integer.

In FIG. 2, when the N input signals are input to the decoder 50, the decoder 50 outputs the $2^N$ input signals, e.g., BP1, BN1, . . . , $BP2^N$, and $BN2^N$, to activate one of $2^N$ magnetic circuits 60 and deactivate the other magnetic circuits among the $2^N$ magnetic circuits 60.

The magnetic circuit 60 includes an upper MTJ cell Rapt, a PMOT transistor P1, an NMOS transistor N1, and a lower MTJ cell Rap1, which are connected in series.

When the magnetic circuit 60 is selected and therefore activated, both the PMOS transistor P1 and the NMOS transistor N1 in the magnetic circuit 60 are turned on in response to corresponding ones of the $2^N$ input signals, e.g., BP1 and BN1. When the magnetic circuit 60 is unselected and thus inactivated, the PMOS transistor P1 and the NMOS transistor N1 are all turned off in response to the corresponding ones of the $2^N$ input signals, e.g., BP1 and BN1.

When the magnetic circuit 60 is activated, an output voltage Vout is determined by a ratio of an upper resistance and a lower resistance, the upper resistance being determined by a resistance Rp1 of the upper MTJ cell Rapt and the PMOS transistor N1, the lower resistance being determined by the NMOS transistor N1 and a resistance Rpt of the lower MTJ cell Rap1.

The magnetic circuit 60 selected in FIG. 2 problematically demands a large power consumption because a current must be continuously supplied for the signal output.

Also, since the plurality of magnetic circuits 60 are commonly connected to one latch 71, a parasitic capacitance at an output node of the selected magnetic circuit 60 becomes large, and thus, the operation speed becomes slow.

Also, one of the two transistors N1 and P1 in the selected magnetic circuit 60 must operate in a saturation region and the other must operate in a linear region. To ensure this, the size of the transistor itself must be large.

In FIG. 2, since each of the magnetic circuits 60 includes the two transistors N1 and P1, an area occupied by the LUT circuit 2 is increased.

SUMMARY

Various embodiments are directed to a LUT capable of reducing a circuit area and power consumption, an FPGA including the LUT, and a technology mapping method applicable to the FPGA.

In an embodiment, a look up table (LUT) may include a decoder configured to decode input signals and to output decoded signals, a storage unit including a plurality of magnetic elements and being configured to select one or more of the plurality of magnetic elements in response to the decoded signals and a signal input/output (IO) unit configured to output an output signal corresponding to the selected one or more magnetic elements and to program the selected one or more magnetic elements by receiving a write signal.

In an embodiment, a field programmable gate array (FPGA) may include a plurality of first LUTs each configured to output a first output signal according to programming states of magnetic elements corresponding to a first input signal during a first time period and a plurality of second LUTs each configured to output a second output signal according to programming states of magnetic elements corresponding to a second input signal during a second time period.

In an embodiment, a technology mapping method for a FPGA may include converting a gate level netlist into an AND-Inverter Graph (AIG) netlist, selecting a node among nodes included in the AIG netlist, generating a cut set including one or more cuts corresponding to the selected node, selecting a best cut by sorting the cuts included in the cut set according to predetermined criteria and outputting a LUT netlist including the best cut, wherein the predetermined criteria include a maximum difference of levels of sub-cuts connected in each cut as a first criterion.

DETAILED DESCRIPTION

Hereafter, various embodiments will be described below in more detail with reference to the accompanying drawings.

Figure 3:
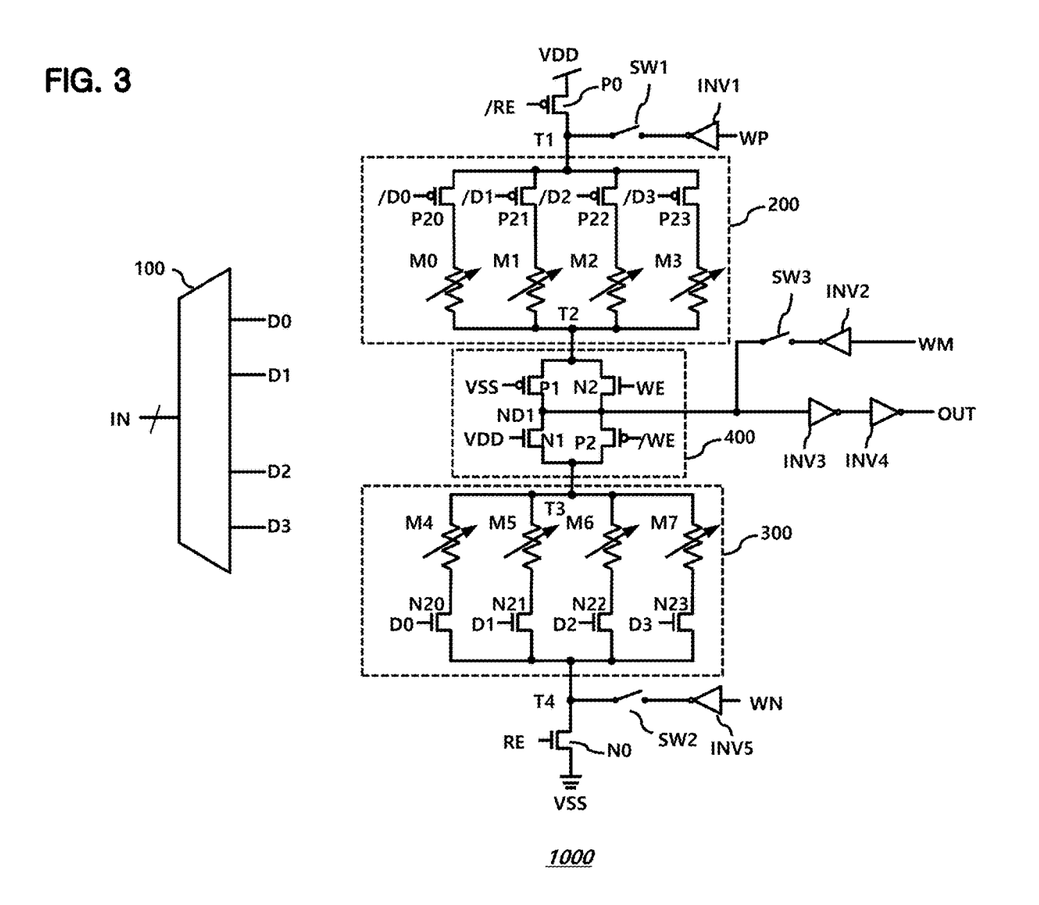
FIG. 3 illustrates a LUT circuit according to a first embodiment of the present disclosure.

FIG. 3 illustrates an LUT circuit 1000 according to a first embodiment of the present disclosure.

In this embodiment, the LUT circuit 1000 is for decoding a 2-bit input signal IN. An LUT circuit corresponding to an input signal of a different number of bits will be easily derived from the present disclosure by an ordinary skill in the art.

The LUT circuit 1000 includes a decoder 100, a first storage unit 200, a second storage unit 300, and a signal input/output (TO) unit 400.

In this embodiment, the decoder 100 receives the 2-bit input signal IN and outputs four decoded signals D0, D1, D2, and D3. At this time, only one of the four decoded signals D0, D1, D2, and D3 is activated, and the others are deactivated.

The first storage unit 200 includes a first terminal T1 and a second terminal T2, and includes a plurality of pairs of MTJ cells and switching transistors between the first terminal T1 and the second terminal T2. Each pair includes one MTJ cell and one switching transistor, which are connected in series.

Referring to FIG. 3, the first storage unit 200 includes four MTJ cells M0, M1, M2, and M3 and four PMOS transistors P20, P21, P22, and P23. Each of the four MTJ cells M0, M1, M2, and M3 is connected in series to a corresponding one of the four PMOS transistors P20, P21, P22, and P23. For example, the MTJ cell M0 and the PMOS transistor P20 are connected in series between the first terminal T1 and the second terminal T2.

Four inverted decoded signals /D0, /D1, /D2, and /D3 are sequentially inputted to the four PMOS transistors P20, P21, P22, and P23, respectively.

One of the four PMOS transistors P20, P21, P22, and P23 is turned on according to the 2-bit input signal IN to select the corresponding MTJ cell.

The second storage unit 300 includes a third terminal T3 and a fourth terminal T4. The second storage unit 300 further includes a plurality of pairs of MTJ cells and switching transistors between the third terminal T3 and the fourth terminal T4.

In FIG. 3, the second storage unit 300 includes four MTJ cells M4, M5, M6, and M7 and four NMOS transistors N20, N21, N22, and N23. Each of the four MTJ cells M4, M5, M6, and M7 is connected in series to a corresponding one of the four NMOS transistors N20, N21, N22, and N23. For example, the MTJ cell M4 and the NMOS transistor N20 are connected in series between the third terminal T3 and the fourth terminal T4.

The four decoded signals D0, D1, D2, and D3 are sequentially input to the four NMOS transistors N20, N21, N22, and N23, respectively.

One of the four NMOS transistors N20, N21, N22, and N23 is turned on according to the 2-bit input signal IN to select the corresponding MTJ cell.

The signal IO unit 400 is connected between the second terminal T2 of the first storage unit 200 and the third terminal T3 of the second storage unit 300.

The signal IO unit 400 outputs a read-out signal according to a program state of a corresponding MTJ cell of the first storage unit 200 and a program state of a corresponding MTJ cell of the second storage unit 300 during a read operation.

The signal IO unit 400 includes a first PMOS transistor P1 and a first NMOS transistor N1 connected in series between the first storage unit 200 and the second storage unit 300, where the first PMOS transistor P1 has a gate to which a ground voltage VSS is applied and the first NMOS transistor N1 has a gate to which a power supply voltage VDD is applied.

The first PMOS transistor P1 and the first NMOS transistor N1 function as clamp transistors for fixing a current flowing through the first storage unit 200 and the second storage unit 300.

In an operation, one of the first PMOS transistor P1 and the first NMOS transistor N1 preferably operates in a saturation region and the other operates in a linear region.

Accordingly, the size of the first PMOS transistor P1 and the first NMOS transistor N1 may be designed relatively larger than the size of each of the switching transistors P20 to P23 and N20 to N23 included in the first storage unit 200 and the second storage unit 300.

A first node ND1 is a common node connecting the first PMOS transistor P1 and the first NMOS transistor N1. The read-out signal is output through the first node ND1.

The LUT circuit 1000 may further include two serially connected inverters INV3 and INV4 that buffer the read-out signal at the first node ND1 and provide an output signal OUT.

The signal IO unit 400 provides an externally applied signal to the first storage unit 200 or to the second storage unit 300 during a write operation.

The storage IO unit 400 further includes a second NMOS transistor N2 and a second PMOS transistor P2, which are connected in series between the first storage unit 200 and the second storage unit 300. The second NMOS transistor N2 and the second PMOS transistor P2 are turned on in response to a write enable signal WE.

The second PMOS transistor P2 and the second NMOS transistor N2 may provide a write current to the first storage unit 200 or the second storage unit 300 during the write operation.

A common node of the second PMOS transistor P2 and the second NMOS transistor N2 is connected to the first node ND1.

The second NMOS transistor N2 is connected in parallel to the first PMOS transistor P1, and the second PMOS transistor P2 is connected in parallel to the first NMOS transistor N1.

The LUT circuit 1000 may further include a switch SW3 and an inverter INV2 for applying a first write signal WM to the first node ND1.

The LUT circuit 1000 according to the present embodiment may further include a PMOS transistor P0. The PMOS transistor P0 is turned on when a read signal RE is activated and applies the power supply voltage VDD to the first storage unit 200.

At this time, the PMOS transistor P0 may be connected between a power supply voltage (VDD) terminal and the first terminal T1 of the first storage unit 200.

The LUT circuit 1000 according to the present embodiment may further include an NMOS transistor N0. The NMOS transistor N0 is turned on when the read signal RE is activated and applies the ground voltage VSS to the second storage unit 300.

At this time, the NMOS transistor N0 may be connected between a ground voltage (VSS) terminal and the fourth terminal T4 of the second storage unit 300.

The LUT circuit 1000 according to the present embodiment further includes an inverter INV1 and a switch SW1 for applying a second write signal WP to the first terminal T1 of the first storage unit 200 when the write enable signal WE is activated.

The LUT circuit 1000 according to the present embodiment further includes an inverter INV5 and a switch SW2 for applying a third write signal WN to the fourth terminal T4 of the second storage unit 300 when the write enable signal WE is activated.

The switches SW1 to SW3 can be independently turned on and off when the write enable signal WE is activated.

The read operation in the LUT circuit 1000 of FIG. 3 will be described below.

During the read operation, the read signal RE is activated, and thus the PMOS transistor P0 and the NMOS transistor N0 are turned on.

In the read operation, when the input signal IN is "00," theb decoded signal D0 is activated and the other decoded signals D1 to D3 are deactivated.

When the decoded signal D0 is activated, the switching transistor P20 in the first storage unit 200 is turned on in response to the inverted decoded signal /D0, and the switching transistor N20 in the second storage unit 300 is turned on in response to the decoded signal D0. As a result, a current path is formed to connect the MTJ cell M0 in the first storage unit 200, the signal IO unit 400, and the MTJ cell M4 in the second storage unit 300.

At this time, the MTJ cells M0 and M4 are pre-programmed to have mutually opposite resistance states.

For example, when the MTJ cell M0 is pre-programmed to have a high resistance state and the MTJ cell M4 is pre-programmed to have a low resistance state, a low voltage signal is output through the first node ND1 by resistance division between the MTJ cell M0 and the MTJ cell M4. On the other hand, when the MTJ cell M0 is pre-programmed to have a low resistance state and the MTJ cell M4 is pre-programmed to have a high resistance state, a high voltage signal is output through the first node ND1.

The write operation in the LUT circuit 1000 of FIG. 3 will be described below.

During the write operation, the read signal RE is deactivated, so that the PMOS transistor P0 and the NMOS transistor N0 are turned off.

In the write operation, when the input signal IN is "00," the decoded signal D0 is activated and the other decoded signals D1 to D3 are inactivated.

When the decoded signal D0 is activated, the switching transistor P20 in the first storage unit 200 is turned on in response to the inverted decoded signal /D0, and the switching transistor N20 in the second storage unit 300 is turned on in response to the decoded signal D0. As a result, a current path is formed to connect the MTJ cell M0 in the first storage unit 200, the signal IO unit 400, and the cell M4 in the second storage unit 300.

For example, it is assumed that the MTJ cell M0 is programmed to have a high resistance state and the MTJ cell M4 is programmed to have a low resistance state.

To program the MTJ cells M0 and M4 as shown above, first, the switches SW1 and SW3 are turned on and the switch SW2 is turned off.

In addition, a high voltage level is applied to the first write signal WM and a high voltage level is applied to the second write signal WP. Thus, the MTJ cell M0 is programmed to have the high resistance state.

The second NMOS transistor N2 may be turned on during the write operation to further provide a write current to the MTJ cell M0.

Then, the switches SW2 and SW3 are turned on and the switch SW1 is turned off.

At this time, the first write signal WM is applied with the high voltage level and the third write signal WN is applied with the low voltage level. Thus, the MTJ cell M4 is programmed to have the low resistance state.

The second PMOS transistor P2 may be turned on during the write operation to further provide a write current to the MTJ cell M4.

In this embodiment, since the first PMOS transistor P1 and the first NMOS transistor N1, which are clamp transistors, are shared for a plurality of MTJ cells, a circuit area of the LUT circuit 1000 can be reduced compared to the prior art.

The LUT circuit 1000 of FIG. 3 easily configures a combinational logic circuit, since the output signal OUT changes substantially and immediately according to a change in the input signal IN. Moreover, the LUT circuit 1000 can easily configure a sequential logic circuit by including a latch circuit for latching the output signal OUT.

Figure 4:
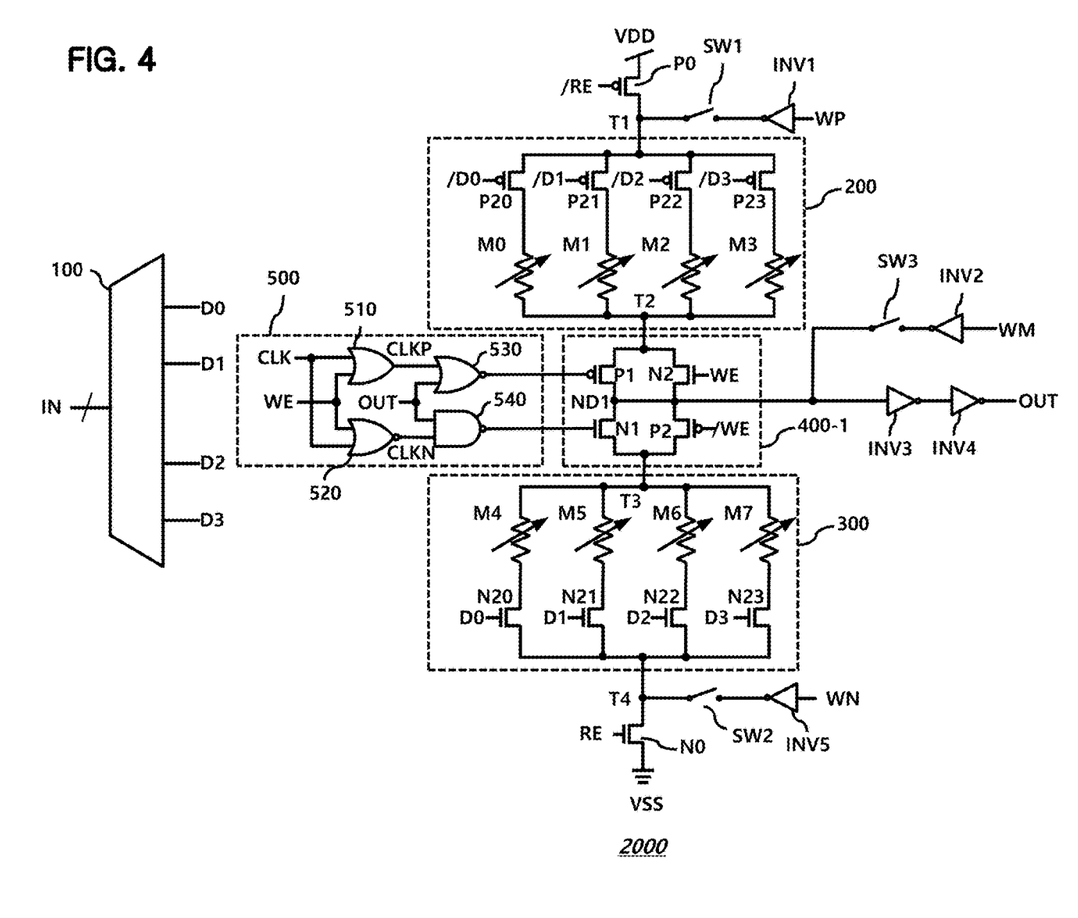
FIG. 4 illustrates a LUT circuit according to a second embodiment of the present disclosure.

FIG. 4 illustrates a LUT circuit 2000 according to a second embodiment of the present disclosure.

The second embodiment of FIG. 4 differs from the first embodiment of FIG. 3 in that the LUT circuit 2000 further includes a signal input/output (IO) control unit 500.

In FIG. 3, the power supply voltage VDD is applied to the gate of the first PMOS transistor P1 of the signal IO unit 400, and the ground voltage VSS is applied to the gate of the first NMOS transistor N1 of the signal IO unit 400.

In FIG. 4, gate voltages of a first PMOS transistor P1 and a first NMOS transistor N1 of a signal IO unit 400-1 are controlled by the signal IO control unit 500.

In this embodiment, the signal IO control unit 500 controls the gate voltages of the first PMOS transistor P1 and the first NMOS transistor N1 according to a clock signal CLK, a write enable signal WE, and an output signal OUT.

A first clock signal CLKP and a second clock signal CLKN are generated based on the clock signal CLK and the write enable signal WE.

When the write enable signal WE is activated, the first clock signal CLKP is fixed to a high level and the second clock signal CLKN is fixed to a low level.

Accordingly, the power supply voltage VDD is applied to the gate of the first NMOS transistor N1 and the ground voltage VSS is applied to the gate of the first PMOS transistor P1, as shown in FIG. 3.

On the other hand, when the write enable signal WE is deactivated, the second clock signal CLKN has a phase substantially opposite to the first clock signal CLKP. The first clock signal CLKP has substantially the same phase as the clock signal CLK. That is, When the write enable signal WE is deactivated, the first clock signal CLKP and the second clock signal CLKN change depending on the clock signal CLK.

In FIG. 4, the signal IO control unit 500 includes an OR gate 510 for performing an OR operation on the clock signal CLK and the write enable signal WE and for outputting the first clock signal CLKP. The signal IO control circuit 500 further includes a NOR gate 520 for performing an NOR operation on the write enable signal WE and the clock signal CLK, and for outputting the second clock signal CLKN.

The signal TO control unit 500 further includes an NOR gate 530 for performing an NOR operation on the first clock signal CLKP and the output signal OUT, in order to control the gate voltage of the first PMOS transistor P1. The signal TO control circuit 500 also includes a NAND gate 540 for performing a NAND operation on the second clock signal CLKN and the output signal OUT in order to control the gate voltage of the first NMOS transistor N1.

When the output signal OUT is at the low level, an output signal of the NAND gate 540 is fixed to the high level and an output of the NOR gate 530 has an opposite level to the first clock signal CLKP.

Since the first clock signal CLKP has the same phase as the clock signal CLK, the first PMOS transistor P1 is turned on when the clock signal CLK is at the high level and is turned off when the clock signal CLK is at the low level, while the first NMOS transistor N1 remains on.

When the output signal OUT is at the high level, the output of the NOR gate 530 is fixed to the low level and the output of the NAND gate 540 has an opposite level to the second clock signal CLKN.

Since the second clock signal CLKN has an opposite phase to the clock signal CLK, the first NMOS transistor N1 is turned on when the clock signal CLK is at the high level, and is turned off when the clock signal CLK is at the low level, while the first PMOS transistor P1 remains on.

In FIG. 4, the signal IO control unit 500 outputs normal signals to turn on the first PMOS transistor P1 and the first NMOS transistor N1 simultaneously when the clock signal CLK is at the high level.

When the clock signal CLK is at the low level, only one of the first PMOS transistor P1 and the first NMOS transistor N1 is turned on according to the output signal OUT, so that a static current passing through the signal IO unit 400 is cut off.

For example, while the clock signal CLK is at the low level, when the output signal OUT is at the high level, the first PMOS transistor P1 is turned on in order to maintain the output signal OUT at the high level; and when the output signal OUT is at the low level, the first NMOS transistor N1 is turned on in order to maintain the output signal OUT at the low level.

Accordingly, the static current, which flows through the first storage unit 200, the signal IO unit 400, and the second storage unit 300 during the read operation, flows only during a first half period of the clock signal CLK, and then is cut off during a second half period of the clock signal CLK following the first half period, so that the power consumption of the LUT circuit 2000 can be reduced.

That is, the signal IO control unit 500 receives the output signal OUT, which is output for a first predetermined time period, e.g., the first half period of the clock signal CLK, in response to an activated decoded signal. The signal IO control unit 500 further controls the signal IO unit 400 to cut off a current, which flows from the power supply voltage terminal to the ground terminal via selected magnetic elements in the first and second storage unit 200 and 300 and the signal IO unit 400, for a second predetermined time period, e.g., the second half period of the clock signal CLK, after the first predetermined time period has elapsed. The signal IO control unit 500 controls the signal IO unit 400 to maintain a level of the output signal OUT for the second predetermined time period after the first predetermined time period has elapsed.

Thus, the LUT circuit 2000 of FIG. 4 can configure a combinational logic circuit, in which the output signal OUT is substantially and immediately changed by a change in the input signal IN during a half period of the clock signal CLK.

The LUT circuit 2000 shown in FIG. 4 outputs a signal corresponding to the input signal IN when the clock signal CLK is at the high level. From the LUT circuit 2000, it is possible to derive a LUT circuit that outputs a signal corresponding to the input signal IN when the clock signal CLK is at the low level.

Figure 5:
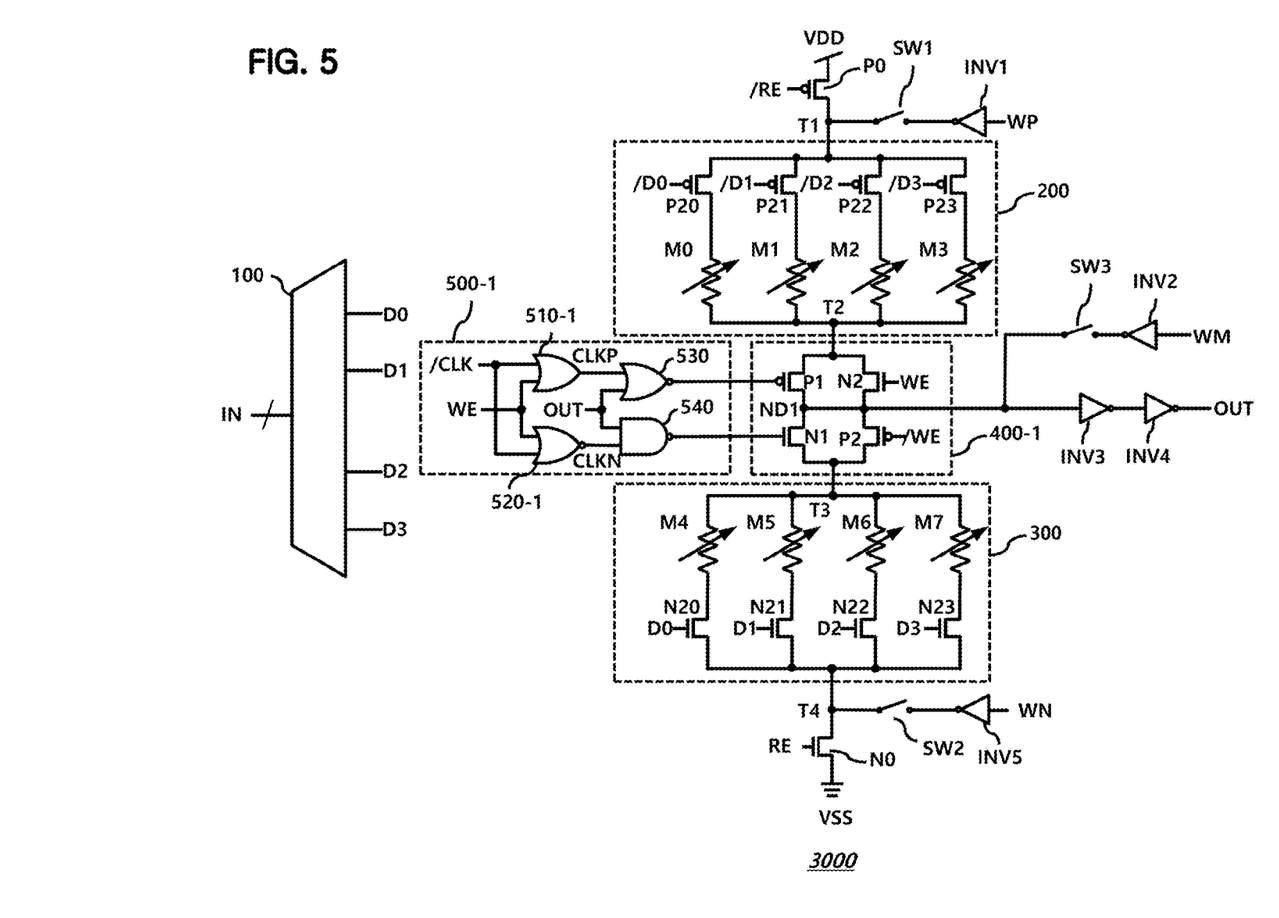
FIG. 5 illustrates a LUT circuit according to a third embodiment of the present disclosure.

FIG. 5 illustrates a LUT circuit 3000 according to a third embodiment of the present disclosure. In FIG. 5, it is possible to implement a LUT circuit that outputs a signal corresponding to the input signal IN when the clock signal CLK is at the low level by applying an inverted clock signal /CLK, rather than the clock signal CLK, to an OR gate 510-1 and an NOR gate 520-1 in a signal IO control unit 500-1.

The LUT circuit 3000 in FIG. 5 is substantially the same as the LUT circuit 2000 in FIG. 4, except that the inverted clock signal /CLK, which is inverted from the clock signal CLK, is applied to the signal IO control unit 500-1. The signal IO control circuit 500-1 has substantially the same configuration as the signal IO control circuit 500 shown in FIG. 4.

Hereinafter, the LUT circuit 1000 shown in FIG. 3 can be referred to as a first LUT circuit 1000, the LUT circuit 2000 shown in FIG. 4 as a second LUT circuit, and the LUT circuit 3000 shown in FIG. 5 as a third LUT circuit.

Generally, an FPGA includes many LUT circuits and is programmed to operate with desired digital logic circuitry.

The FPGA according to an embodiment of the present disclosure may include at least one LUT circuit among the first LUT circuit 1000, the second LUT circuit 2000, and the third LUT circuit 3000.

In particular, the FPGA according to an embodiment of the present disclosure may include both the second LUT circuit 2000 and the third LUT circuit 3000.

This means that the FPGA includes both a LUT circuit operating during one half of the clock signal CLK and a LUT circuit operating during the other half of the clock signal CLK.

In order for the FPGA to function as a desired digital logic circuit, it is necessary to connect a plurality of LUT circuits contained in the FPGA through a program. This operation is called a technology mapping method.

More specifically, the technology mapping method refers to a task of converting a netlist of a gate level, which describes a digital logic circuit, into a netlist of a LUT level, which describes the constituent units of the FPGA.

In the embodiment including the second LUT circuit 2000 and the third LUT circuit 3000, which operate in different phases of the clock signal CLK, among the FPGAs according to the embodiment of the present disclosure, a technology mapping method for efficiently using the second circuit LUT 2000 and the third LUT circuit 3000 is required.

Figure 6:
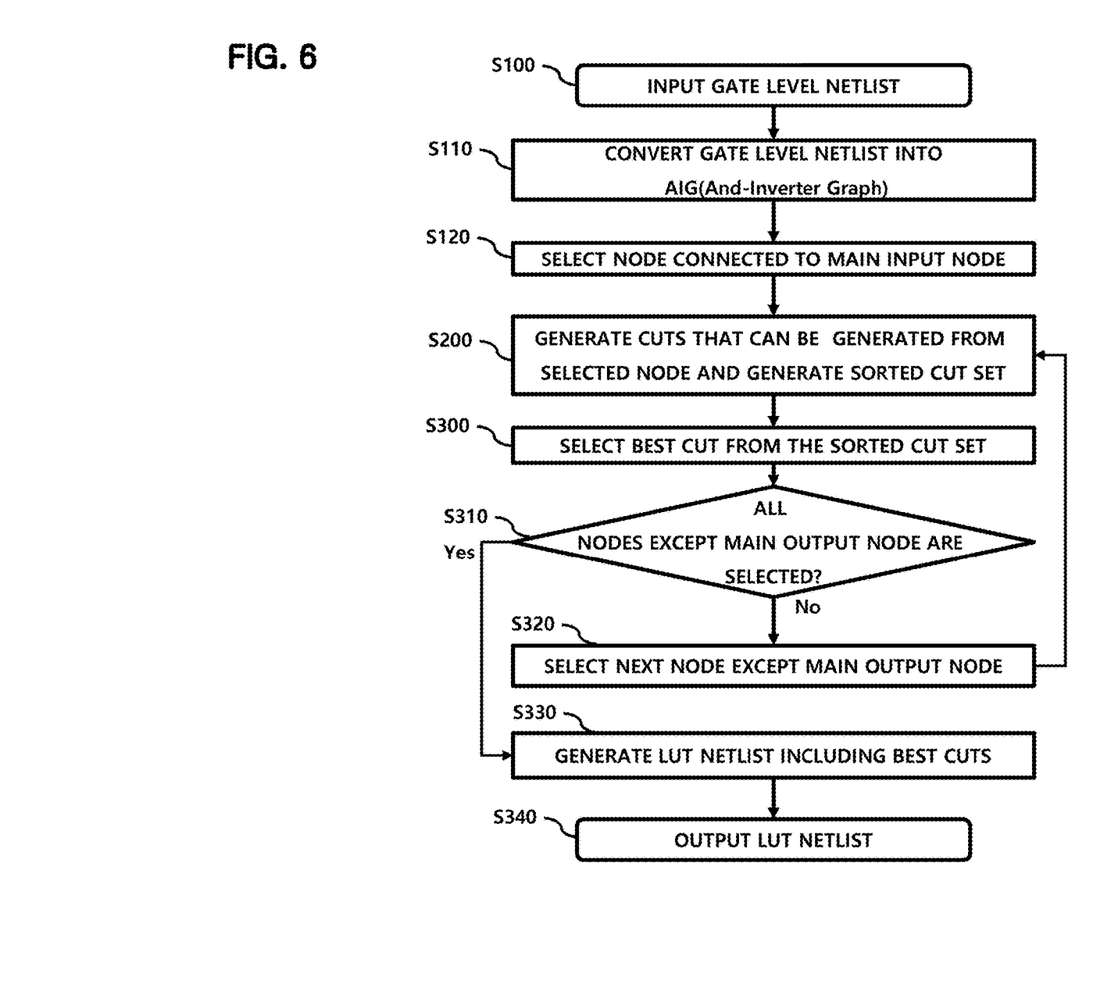
FIG. 6 is a flowchart illustrating a technology mapping method for an FPGA according to an embodiment of the present disclosure.

FIG. 6 is a flowchart illustrating a technology mapping method in an FPGA according to an embodiment of the present disclosure.

First, a gate level netlist is input at step S100.

Next, the gate level netlist is converted into an AND-INVERTER GRAPH (AIG) at step S110.

Next, a node connected to a main input node is selected at step S120.

In the AIG, each node corresponds to either a NAND gate or an AND gate. In this case, a set of nodes that can be created using one LUT can be referred to as a 'cut.'

In the AIG, a signal input is referred as the main input node and a signal output is referred as a main output node. The main input node and the main output node correspond to an input or an output itself rather a gate.

After that, all cuts that can be created from the selected node are generated, and a sorted cut set is generated at step S200.

In this case, a cut is a set of one or more nodes that can be included in one LUT. A cut created from the selected node includes the selected node and may or may not include another node in the same LUT.

The number of the cuts that can be created from the selected node can be one or more. The cut set including the one or more cuts can be sorted by predetermined criteria.

For example, an area where a cut is used, an amount of delay when the cut is used, and the like, can be used as the predetermined criteria.

The best cut is selected from the sorted cut set at step S300.

The best cut may correspond to a cut for minimizing the area, a cut for minimizing the amount of delay, or the like.

Thereafter, it is checked whether all nodes other than the main output node are selected at step S310.

If all the nodes other than the main output node are not selected, the next node is selected and the process returns to step S200.

If all the nodes other than the main output node are selected, a LUT netlist including the best cuts is generated for all the nodes at step S330.

Finally, the generated LUT netlist is output at step S340.

Figure 7:
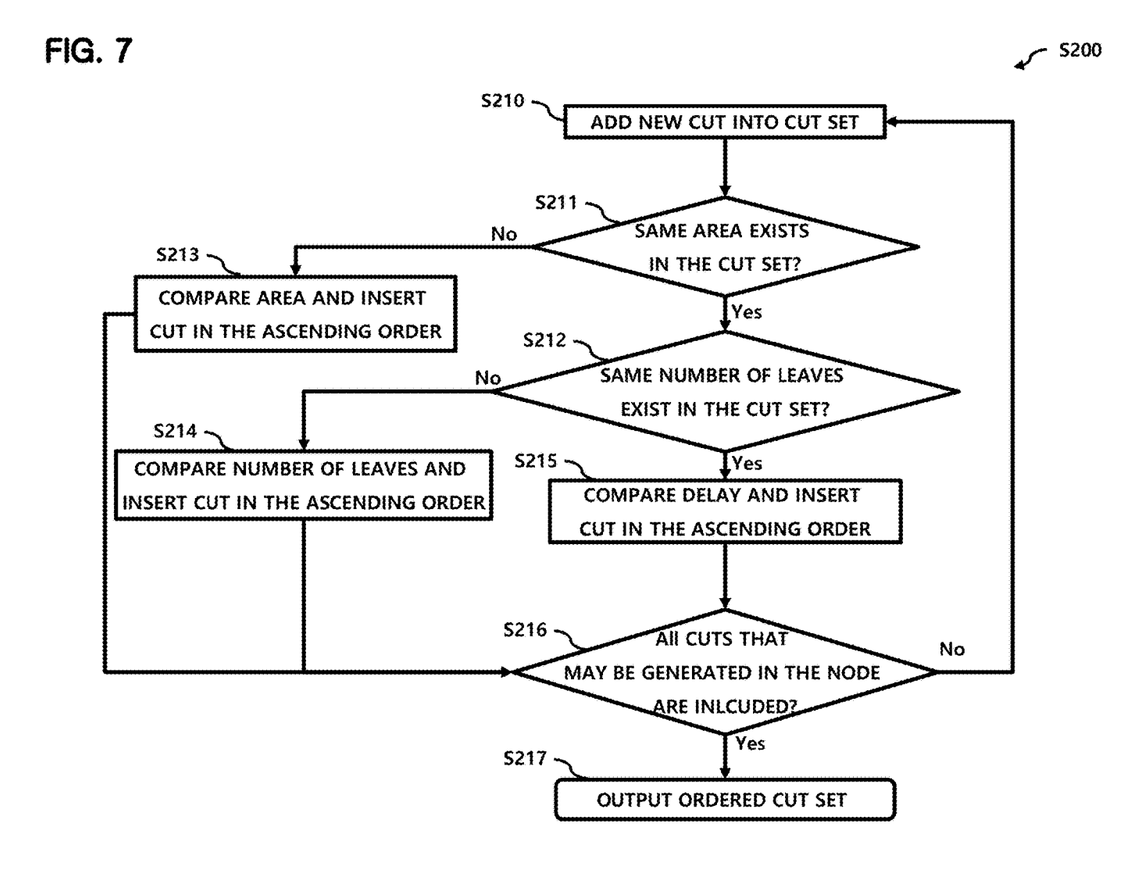
FIG. 7 is a flowchart illustrating a method for generating a cut set in FIG. 6 according to an embodiment of the present disclosure.

FIG. 7 is a flowchart illustrating the step S200 for generating the sorted cut set in FIG. 6 according to an embodiment.

The embodiment of FIG. 7 may be advantageously used when only the first LUT circuit 1000 is included in the FPGA.

The embodiment of FIG. 7 sorts cuts in a cut set in the order of the area, the number of leaves, and the amount of delay.

First, a new cut is added to the cut set at step S210.

An area corresponding to the new cut is calculated and it is determined whether any of the other cuts included in the cut set has the same area as the new cut at step S211.

In this case, the area is an area occupied by a cut, and a technique of calculating the area of the cut and sorting the cuts according to the area can be calculated by a conventional technique and thus a detailed description thereof will be omitted.

If there is no cut having the same area in the cut set, the new cut is inserted between the existing cuts in the ascending order based on the area at step S213, and the process proceeds to step S216.

If there exist one or more cuts having the same area, the number of leaves corresponding to the new cut is calculated and it is determined whether the number of leaves in the cuts having the same area included at step S212. Here, a leaf refers to a node included in the cut.

If there is no cut having the same number of leaves as the new cut, the new cut is inserted between the existing cuts in the ascending order based on the number of leaves at step S214, and the process proceeds to step S216.

If there exist one or more cuts having the same number of leaves, a delay corresponding to the new cut is calculated and the new cut is inserted between the existing cuts in the ascending order based on the delay at step S215. The calculation of the delay amount in the cut is to calculate a time to pass through a gate, which is known to people having ordinary skill in the art using conventional techniques, and thus a detailed description thereof will be omitted.

Then, it is determined whether all the cuts that can be generated at a node, have been added at step S216.

If all the cuts are added, the sorted cut set is output at step S217. Otherwise, the processes from step S210 to step S216 are repeated.

Figure 8:
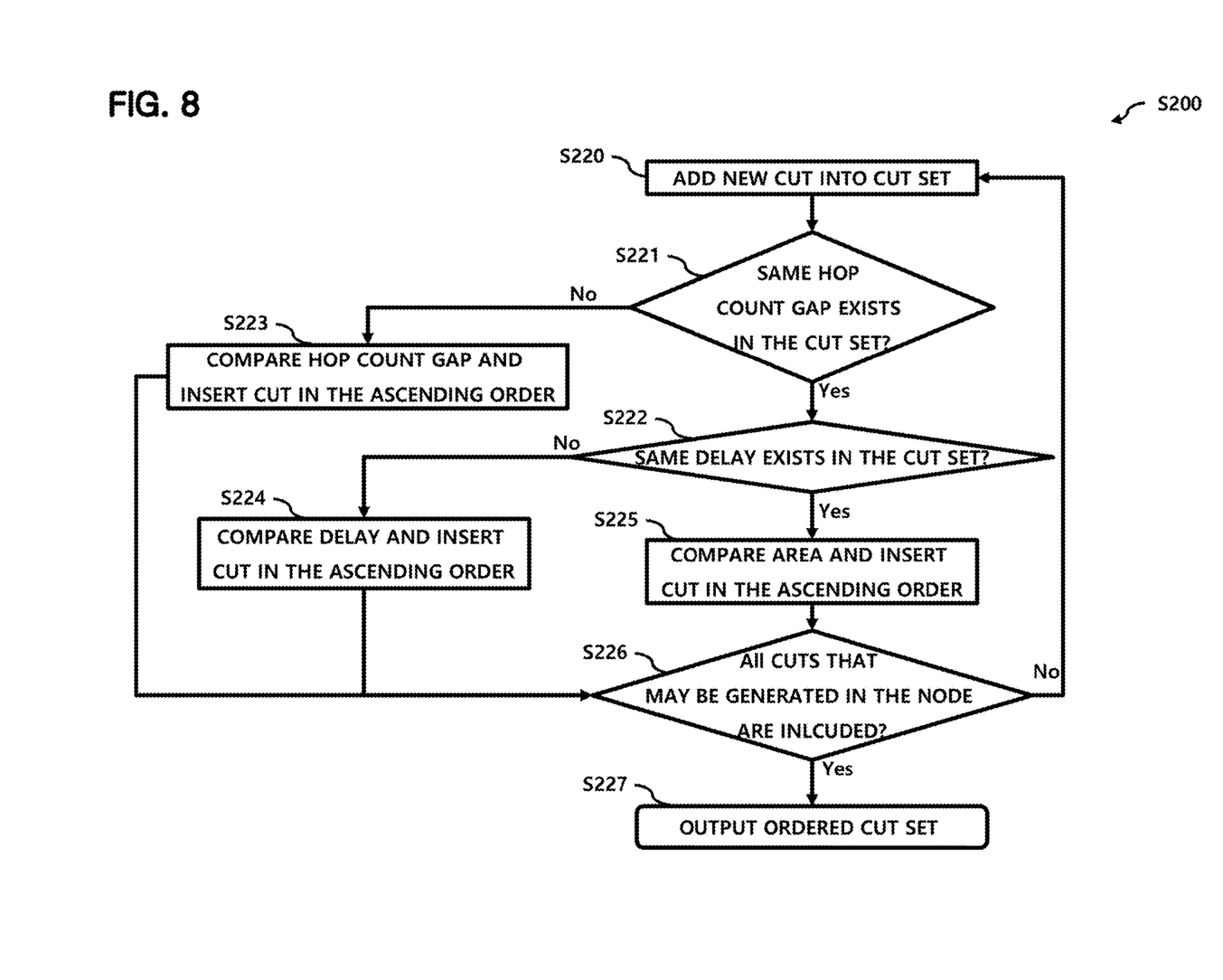
FIG. 8 is a flowchart illustrating a method for generating a cut set in FIG. 6 according to another embodiment of the present disclosure.

FIG. 8 is a flowchart illustrating a method for performing the step S200 for generating the sorted cut set in FIG. 6 according to another embodiment.

The embodiment of FIG. 8 may be advantageously used when the second LUT circuit 2000 and the third LUT circuit 3000 are included in the FPGA.

The embodiment of FIG. 8 sorts cuts within a cut set in the order of a hop count gap, a delay, and an area.

The hop count gap represents a maximum difference in the number of levels of sub-cuts connected to a current cut.

For example, the hop count gap of a node becomes three if the current cut is connected to two sub-cuts where one has three levels and the other has a zero level.

In this embodiment, the smaller a hop count gap corresponding to a cut, the better the cut is considered.

First, a new cut is added to the cut set at step S220.

The hop count gap is calculated for the new cut, and compared with hop count gaps of the other cuts in the cut set, to determine if one or more cuts having the same hop count gap as the new cut exists at step S221.

If there is no cut having the same hop count gap as the new cut, the current cut is interposed between existing cuts in ascending order based on the hop count gap of the new cut at step S223, and the process proceeds to step S226.

If one or more cuts having the same hop count gap as the new cut exist, a delay corresponding to the new cut is calculated and it is determined whether there exist one or more cuts having the same delay as the new cut among the cuts having the same hop count gap at step S222.

If there is no cut having the same delay as the new cut, the new cut is inserted between the existing cuts in the ascending order based on the delay of the new cut at step S224 and the process proceeds to step S226.

If one or more cuts having the same delay exists, an area corresponding to the new cut is calculated and the new cut is inserted between the existing cuts in the ascending order based on the area of the new cut at step S225.

Then, it is determined whether all cuts that can be generated at a node have been generated at step S226.

If all the cuts are generated, the LUT netlist is output at step S227. If all the cuts are not generated, the processes from step S220 to step S226 are repeated.

When the FPGA includes the second LUT circuit 2000 and the third LUT circuit 3000, an operation of matching an LUT, which is included in the LUT netlist that is output according to the flowcharts of FIGS. 6 and 8, to one of the second LUT circuit 2000 or the third LUT circuit 3000 may be further performed.

For example, each LUT included in the LUT netlist may be randomly matched to either the second LUT circuit 2000 or the third LUT circuit 3000.

Figure 9:
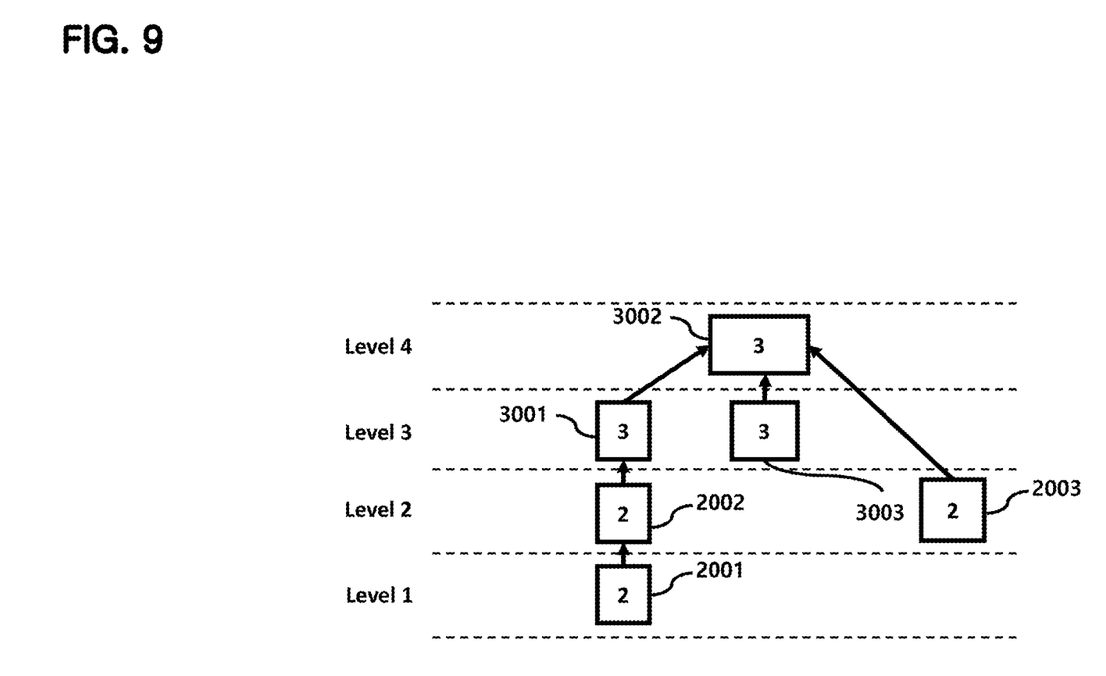
FIG. 9 illustrates a LUT matching operation in an FPGA according to an embodiment of the present disclosure.

FIG. 9 illustrates a method of matching a LUT included in a LUT netlist.

When the LUT netlist is completed, a level of each LUT can be distinguished based on the longest signal transmission path as shown in FIG. 9.

In FIG. 9, the rectangle represents each LUT, the arrow represents a signal propagation path, and the numbers in the rectangle indicate kinds of LUT. The number 2 represents the LUT is matched to the second LUT circuit 2000 of FIG. 4, and the number 3 represents the LUT is matched to the third LUT circuit 3000 of FIG. 5.

The second LUT circuit 2000 outputs a signal when a clock signal is at a high level and the third LUT circuit 3000 outputs the signal when the clock signal is at a low level.

Accordingly, in FIG. 9, LUTs included in lower levels, e.g., levels 1 and 2, are matched with the second LUT circuit 2000, and LUTs included in upper levels, e.g., levels 3 and 4, are matched with the third LUT circuit 3000.

Accordingly, in FIG. 9, the LUTs 2001 and 2002 are matched to the second LUT circuit 2000, and the LUTs 3001 and 3002 are matched to the third LUT circuit 3000.

In FIG. 9, the LUTs 2003 and 3003 may belong to any of levels 1 to 3.

These LUTs 2003 and 3003 may be arbitrarily matched to either the second LUT circuit 2000 or the third LUT circuit 3000.

A ratio between the number of LUTs matched to the second LUT circuit 2000 and the number of LUTs matched to the third LUT circuit 3000 preferably approaches 1.

In FIG. 9, the LUT 2003 is matched to the second circuit LUT 2000, and the LUT 3003 is matched to the third LUT circuit 3000.

Accordingly, three of the six LUTs shown in FIG. 9 may be matched to the second LUT circuit 2000, and the remaining three of the six LUTs may be matched to the third LUT circuit 3000.

It has been found that when the technology mapping method is performed in the FPGA including the second LUT circuit 2000 and the third LUT circuit 3000 in an equal number, it is advantageous to select the best cut in the order of the smallest hop count gap in order to make the usage ratio between the second LUT circuit 2000 and the third LUT circuit 3000 close to 1.

Although various embodiments have been described for illustrative purposes, it will be apparent to those skilled in the art that various changes and modifications may be made without departing from the spirit and scope of the invention as defined in the following claims.

What is claimed is:

1. A look up table (LUT), comprising:
   a decoder configured to decode input signals and to output decoded signals;
   a storage unit including a plurality of magnetic elements, the storage unit being configured to select one or more of the plurality of magnetic elements in response to the decoded signals; and
   a signal input/output (TO) unit configured to output an output signal corresponding to the selected one or more magnetic elements and to program the selected one or more magnetic elements by receiving a write signal.

2. The LUT of claim 1, further comprising:
   a signal TO control unit configured to receive the output signal corresponding to an activated decoded signal among the decoded signals during a first time period, and to control the signal TO unit to cut off a current flowing from a power source terminal to a ground terminal via the selected one or more magnetic elements in the storage unit and the signal TO unit during a second time period after the first time period has elapsed.

3. The LUT of claim 2, wherein the signal TO control unit is configured to control the signal TO unit in order to maintain a level of the output signal for the second time period after the first time period has elapsed.

4. The LUT of claim 1, wherein the storage unit comprises:
   a first storage unit connected between a first terminal and a second terminal, the first storage unit being configured to select a magnetic element according to an inverted decoded signal, the inverted decoded signal being an inversion of an activated decoded signal among the decoded signals; and
   a second storage unit connected between a third terminal and a fourth terminal, the second storage unit being configured to select a magnetic element according to the activated decoded signal.

5. The LUT of claim 4, wherein the first terminal is connected to a power source, the fourth terminal is connected to a ground, and the signal TO unit is connected between the second terminal and the third terminal.

6. The LUT of claim 5, wherein the signal TO unit comprises a first PMOS transistor and a first NMOS transistor connected in series between the second terminal and the third terminal, drains of the first PMOS transistor and the first NMOS transistor are commonly connected to a first node, and the first node outputs an output signal or is input a write signal.

7. The LUT of claim 6, further comprising:
a signal TO control unit configured to control gates of the first PMOS transistor and the first NMOS transistor so that the first PMOS transistor and the first NMOS transistor are turned on during a first time period and at least one of the first PMOS transistor and the first NMOS transistor is turned off during a second time period after the first time period has elapsed.

8. The LUT of claim 7, wherein the signal TO control unit is configured to control gates of the first PMOS transistor and the first NMOS transistor in order to maintain a level of the output signal during the second time period after the first time period has elapsed.

9. The LUT of claim 8, wherein the signal TO control unit comprises:
an NOR gate configured to perform an NOR operation on a first clock signal and the output signal to control the gate of the first PMOS transistor; and
a NAND gate configured to perform a NAND operation on a second clock signal to control the gate of the first NMOS transistor, the second clock signal having an opposite phase to the first clock signal.

10. The LUT of claim 9, wherein the signal TO control unit further comprises:
an OR gate configured to perform an OR operation on a clock signal and a write enable signal, and to output the first clock signal; and
an NOR gate configured to perform an NOR operation on the clock signal and the write enable signal, and to output the second clock signal.

11. The LUT of claim 6, wherein the signal TO unit further comprises:
a second NMOS transistor being turned on during a write operation and being connected in parallel to the first PMOS transistor; and
a second PMOS transistor being turned on during the write operation and being connected in parallel to the first NMOS transistor.

12. The LUT of claim 6, further comprising:
a switch configured to provide a first write signal to the first node during a write operation;
a switch configured to provide a second write signal to the first terminal during the write operation; and
a switch configured to provide a third write signal to the fourth terminal during the write operation.

13. A field programmable gate array (FPGA), comprising:
a plurality of first LUTs each configured to output a first output signal according to programming states of magnetic elements corresponding to a first input signal during a first time period; and
a plurality of second LUTs each configured to output a second output signal according to programming states of magnetic elements corresponding to a second input signal during a second time period.

14. The FPGA of claim 13, wherein each of the plurality of first LUTs maintains a level of the first output signal for the second time period after the first time period has elapsed, and each of the plurality of second LUTs maintains a level of the second output signal for the first time period after the second time period has elapsed.

15. The FPGA of claim 13, wherein each of the plurality of first LUTs comprises:
a decoder configured to decode the first input signal and to output decoded signals;
a storage unit including a plurality of magnetic elements, the storage unit being configured to select one or more of the plurality of magnetic elements in response to the decoded signals; and
a signal IO unit configured to output the first output signal corresponding to the selected one or more magnetic elements, and to receive a write signal to program the selected one or more magnetic elements.

16. The FPGA of claim 15, wherein the storage unit comprises:
a first storage unit connected between a first terminal and a second terminal and configured to select a magnetic element according to an inverted decoded signal, the inverted decoded signal being an inversion of an activated decoded signal among the decoded signals; and
a second storage unit connected between a third terminal and a fourth terminal and configured to select a magnetic element according to the activated decoded signal,
wherein the signal IO unit comprises a first PMOS transistor and a first NMOS transistor connected in series between the second terminal and the third terminal, drains of the first PMOS transistor and the first NMOS transistor are commonly connected to a first node, and a signal is input or output via the first node, and
wherein the signal TO control unit is configured to control gates of the first PMOS transistor and the first NMOS transistor in order to maintain a level of the first output signal for the second time period after the first time period has elapsed.

17. The FPGA of claim 13, wherein each of the plurality of second LUTs comprises:
a decoder configured to decode the second input signal and to output decoded signals;
a storage unit including a plurality of magnetic elements, the storage unit being configured to select one or more of the plurality of magnetic elements in response to the decoded signals; and
a signal IO unit configured to output the second output signal corresponding to the selected one or more magnetic elements, and to program the selected one or more magnetic elements by receiving a write signal.

18. The FPGA of claim 17, wherein the storage unit comprises:
a first storage unit connected between a first terminal and a second terminal and configured to select a magnetic element according to an inverted decoded signal, the inverted decoded signal being an inversion of an activated decoded signal among the decoded signals; and
a second storage unit connected between a third terminal and a fourth terminal and configured to select a magnetic element according to the activated decoded signal,
wherein the signal IO unit comprises a first PMOS transistor and a first NMOS transistor connected in series between the second terminal and the third terminal, drains of the first PMOS transistor and the first NMOS transistor are commonly connected to a first node, and a signal is input or output via the first node, and wherein the signal IO control unit is configured to control gates of the first PMOS transistor and the first NMOS transistor in order to maintain a level of the second output signal for the first time period after the second time period has elapsed.

19. The FPGA of claim 13, wherein the first time period corresponds to a time period when a clock signal is at a high level and the second time period corresponds to a time period when the clock signal is at a low level.

* * * * *